(12) United States Patent
Hoel et al.

(10) Patent No.: US 10,822,696 B2
(45) Date of Patent: Nov. 3, 2020

(54) ARTICLE WITH THERMAL BARRIER COATING AND METHOD FOR MAKING

(71) Applicant: GENERAL ELECTRIC COMPANY, Schenectady, NY (US)

(72) Inventors: Cathleen Ann Hoel, Schenectady, NY (US); Kristen Hall Brosnan, Schenectady, NY (US); Curtis Alan Johnson, Niskayuna, NY (US); Shankar Sivaramakrishnan, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 497 days.

(21) Appl. No.: 15/378,232

(22) Filed: Dec. 14, 2016

(65) Prior Publication Data

US 2018/0163062 A1 Jun. 14, 2018

(51) Int. Cl.
*C23C 4/00* (2016.01)
*C23C 16/455* (2006.01)
(Continued)

(52) U.S. Cl.
CPC .......... *C23C 16/455* (2013.01); *C04B 35/48* (2013.01); *C04B 35/62222* (2013.01);
(Continued)

(58) Field of Classification Search
CPC ... C04B 41/52; C04B 41/522; F05D 2230/90; F05B 2230/90
See application file for complete search history.

(56) References Cited

U.S. PATENT DOCUMENTS

| 5,871,820 A | 2/1999 | Hasz et al. |
| 2,876,860 A | 3/1999 | Marijnissen et al. |

(Continued)

FOREIGN PATENT DOCUMENTS

| CN | 102371734 B | 2/2014 |
| EP | 0783043 A1 | 9/1997 |

(Continued)

OTHER PUBLICATIONS

Cunha, F.; "4.4 Heat Transfer Analysis: from The Gas Turbine Handbook", ed. Dennis, R.,; , 2006, p. 389-411.*

(Continued)

*Primary Examiner* — Humera N. Sheikh
*Assistant Examiner* — Julia L Rummel
(74) *Attorney, Agent, or Firm* — The Small Patent Law Group LLC; Mary D. Lawlor

(57) ABSTRACT

An article for service at high temperatures comprises a substrate comprising a first region and a second region; and a coating disposed over the substrate. The coating comprises a first portion disposed over the first region of the substrate and a second portion disposed over the second region of the substrate. The coating includes a layer comprising a ceramic material and further including a quantity of surface-connected voids, and a protective agent is disposed within at least some of the surface-connected voids of the layer. Within the first portion, the agent is present within the layer at a concentration of less than or equal to 4 percent by volume of the layer exclusive of the voids, while, within the second portion, the agent is present within the layer at a concentration up to the carrying capacity of the layer. Methods for forming the article are also presented.

15 Claims, 3 Drawing Sheets

Figure 1:
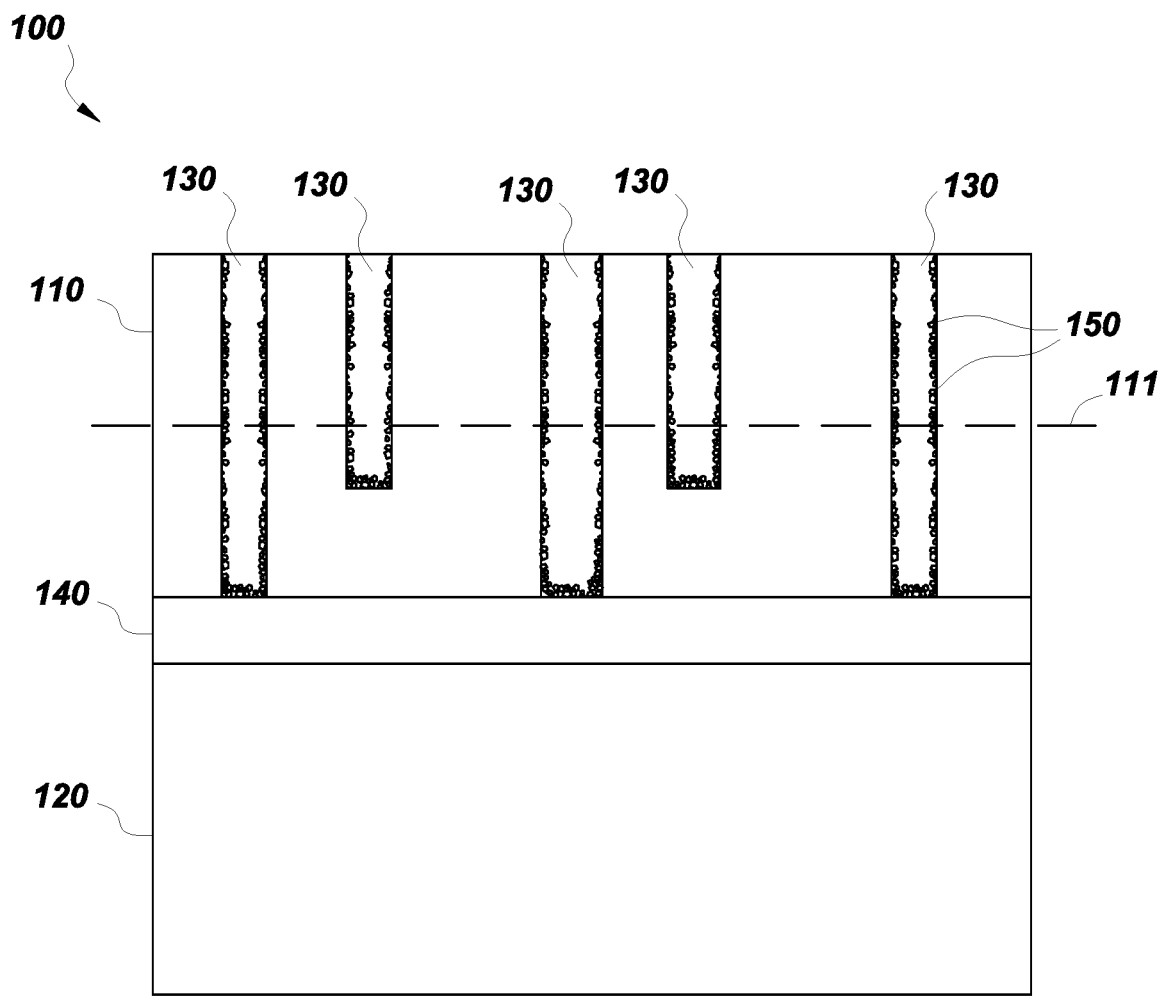

(51) Int. Cl.
    *C09D 1/00*     (2006.01)
    *C04B 35/48*     (2006.01)
    *C04B 35/622*     (2006.01)
    *C23C 4/18*     (2006.01)
    *C23C 4/11*     (2016.01)
    *C04B 41/52*     (2006.01)

(52) U.S. Cl.
    CPC ................. *C09D 1/00* (2013.01); *C23C 4/11* (2016.01); *C23C 4/18* (2013.01); *C04B 41/52* (2013.01); *C04B 2235/3225* (2013.01); *F05B 2230/90* (2013.01); *F05D 2230/90* (2013.01)

(56) References Cited

U.S. PATENT DOCUMENTS

| | | |
|---|---|---|
| 6,117,560 A | 9/2000 | Maloney |
| 6,177,200 B1 | 1/2001 | Maloney |
| 6,890,668 B2 | 5/2005 | Bruce et al. |
| 6,924,040 B2 | 8/2005 | Maloney |
| 7,150,926 B2 | 12/2006 | Strangman |
| 7,326,468 B2 | 2/2008 | Spitsberg et al. |
| 7,374,825 B2 | 5/2008 | Hazel et al. |
| 7,662,489 B2 | 2/2010 | Litton et al. |
| 7,722,959 B2 | 5/2010 | Schglichting et al. |
| 7,780,832 B2 | 8/2010 | Hasz |
| 8,062,759 B2 | 11/2011 | Fu et al. |
| 8,080,283 B2 | 12/2011 | Schlichting et al. |
| 8,337,939 B2 | 12/2012 | Striker et al. |
| 8,356,482 B2 | 1/2013 | Duval et al. |
| 8,529,999 B2 | 9/2013 | Maloney et al. |
| 8,658,255 B2 | 2/2014 | Kirby et al. |
| 8,658,291 B2 | 2/2014 | Kirby et al. |
| 2004/0001977 A1 | 1/2004 | Subramanian |
| 2004/0115470 A1 | 6/2004 | Ackerman et al. |
| 2007/0119713 A1 | 5/2007 | Hasz |
| 2007/0160859 A1 | 7/2007 | Darolia et al. |
| 2009/0169752 A1 | 7/2009 | Fu et al. |
| 2013/0004309 A1* | 1/2013 | Sambasivan .......... C04B 35/195 415/208.1 |
| 2013/0130052 A1 | 5/2013 | Menuey et al. |
| 2015/0014179 A1 | 9/2015 | Hasz et al. |
| 2016/0115818 A1 | 4/2016 | Porob et al. |
| 2016/0115819 A1 | 4/2016 | Nayak et al. |
| 2016/0168684 A1 | 6/2016 | Brosnan et al. |

FOREIGN PATENT DOCUMENTS

| | | |
|---|---|---|
| EP | 1295965 A2 | 3/2003 |
| EP | 1788122 A1 | 5/2007 |
| EP | 1806435 A2 | 7/2007 |
| EP | 2766504 A2 | 8/2014 |
| JP | 2012062511 A | 3/2012 |
| JP | 2013129917 A | 4/2013 |
| WO | 2012012431 A1 | 1/2012 |
| WO | 2014035413 A1 | 3/2014 |
| WO | 2015116300 A2 | 8/2015 |

OTHER PUBLICATIONS

Tailored TBC for Resistance to CMAS, Erosion, and Impact, The IP.com Prior Art Database, Apr. 7, 2008.

Mohan et al., Electrophoretically deposited alumina as protective overlay for thermal barrier coatings against CMAS degradation, Surface and Coatings Technology, vol. 204, Issues 6-7, pp. 797-801, Dec. 25, 2009.

Munez et al., Improving thermal barrier coatings by laser remelting, Journal of Nanoscience and Technology, vol. 10, pp. 8724-8729, Oct. 11, 2011.

Schultz et al., "Degradation of La2Zr2O7 and other novel EB-PVD thermal barrier coatings by CMAS (CaO—MgO—Ai2O3—SiO2) and volcanic ash deposits," Surface and Coatings Technology, Science Direct, vol. 235, pp. 165-173, Nov. 25, 2013.

Li Wang, "Thermal Cycling and Thermal Radiation Performances of Novel Thermal Barrier Coatings," Electronics Thesis & Dissertation Collection, May 29, 2013.

Kramer et al., "Infiltration-inhibiting Reaction of Gadolinium Zirconate Thermal Barrier Coatings with CM?AS Melts," Journal of the American Ceramic Society, Wiley Online Library, vol. 91, Issue 2, pp. 576-583, Feb. 2008.

Cai et al., "Complex Ceramic Structures I Weberites," Acta Crystallographica, Part B, vol. 63, Part 3, Mar. 27, 2009, pp. 269-290.

M. Nyak et al., "Article and Method of Making Thereof," U.S. Appl. No. 14/525,586, filed Oct. 28, 2014.

D. Porob et al., : "Article and Method of making Thereof," U.S. Appl. No. 14/524,072, filed Oct. 27, 2014.

EP Search Report Application No. 151983574-1362, dated Apr. 16, 2013.

* cited by examiner

ARTICLE WITH THERMAL BARRIER COATING AND METHOD FOR MAKING

BACKGROUND

This disclosure generally relates to articles employing thermally protective coatings. More particularly, this disclosure relates to articles employing coatings that are resistant to degradation due to high-temperature interactions with dust materials.

Thermal barrier coatings are typically used in articles that operate at or are exposed to high temperatures. Aviation turbines and land-based turbines, for example, may include one or more components protected by the thermal barrier coatings. Under normal conditions of operation, coated components may be susceptible to various types of damage, including erosion, oxidation, and attack from environmental contaminants.

For turbine components, environmental contaminant compositions of particular concern are those containing oxides of calcium, magnesium, aluminum, silicon, and mixtures thereof; dirt, ash, and dust ingested by gas turbine engines, for instance, are often made up of such compounds. These oxides often combine to form contaminant compositions comprising mixed calcium-magnesium-aluminum-silicon-oxide systems (Ca—Mg—Al—Si—O), hereafter referred to as "CMAS." At the high turbine operating temperatures, these environmental contaminants can adhere to the hot thermal barrier coating surface, and thus cause damage to the thermal barrier coating. For example, CMAS can form compositions that are liquid or molten at the operating temperatures of the turbines. The molten CMAS composition can dissolve the thermal barrier coating, or can fill its porous structure by infiltrating the pores, channels, cracks, or other cavities in the coating. Upon cooling, the infiltrated CMAS composition solidifies and reduces the coating strain tolerance, thus initiating and propagating cracks that may cause delamination and spalling of the coating material. This may further result in partial or complete loss of the thermal protection provided to the underlying metal substrate of the part or component. Further, spallation of the thermal barrier coating may create hot spots in the metal substrate leading to premature component failure. Premature component failure can lead to unscheduled maintenance as well as parts replacement resulting in reduced performance, and increased operating and servicing costs.

Thus, there is a need for improved coating systems that provide protection to thermal barrier coatings from the adverse effects of environmental contaminants, when operated at or exposed to high temperatures. In particular, there is a need for improved coating systems, and methods for making such coatings, that provide protection from the adverse effects of deposited CMAS.

BRIEF DESCRIPTION

Embodiments of the present invention are provided to meet this and other needs. One embodiment is an article. The article comprises a substrate comprising a first region and a second region; and a coating disposed over the substrate. The coating comprises a first portion disposed over the first region of the substrate and a second portion disposed over the second region of the substrate. The coating includes a layer comprising a ceramic material and further including a quantity of surface-connected voids, and a protective agent is disposed within at least some of the surface-connected voids of the layer. Within the first portion, the agent is present within the layer at a concentration of less than or equal to 4 percent by volume of the layer exclusive of the voids, while, within the second portion, the agent is present within the layer at a concentration up to the carrying capacity of the layer.

Another embodiment is an article. The article comprises a substrate comprising a first region and a second region. The first region includes a feature having a higher convex curvature than the second region. The substrate further comprises a nickel-based superalloy, a cobalt-based superalloy, an iron-based superalloy, or a combination including one or more of the foregoing. A coating is disposed over the substrate; the coating comprises a first portion disposed over the first region of the substrate and a second portion disposed over the second region of the substrate. The coating includes a layer comprising yttria-stabilized zirconia and a quantity of surface-connected voids of up to 15 volume percent of the layer. A protective agent comprising aluminum oxide is disposed within at least some of the surface-connected voids of the layer. Within the first portion, the agent is present within the layer at a concentration of less than or equal to 3 percent by volume of the layer exclusive of the voids, and, within the second portion, the agent is present within the layer at a concentration up to the carrying capacity of the layer.

Another embodiment is a method for making an article such as the articles described herein. The method includes disposing a protective agent within surface-connected voids of a layer of a coating disposed on a substrate, the coating comprising a first portion disposed over a first region of the substrate and a second portion disposed over a second region of the substrate, the layer comprising a ceramic material. Within the first portion, the agent is disposed within the layer at a concentration of less than or equal to 4 percent by volume of the layer exclusive of the voids, and, within the second portion, the agent is disposed within the layer at a concentration up to the carrying capacity of the layer.

Another embodiment is a method for fabricating an article such as the articles described herein. The method includes the following steps: 1) infiltrating a liquid solution comprising an agent precursor comprising an aluminum compound into surface-connected void space of a layer of a coating disposed on a substrate, the layer comprising yttria-stabilized zirconia, the coating comprising a first portion disposed over a first region of the substrate and a second portion disposed over a second region of the substrate, and the first region comprising a feature having a higher convex curvature than the second region; 2) volatilizing the liquid; and 3) converting the agent precursor into a protective agent comprising aluminum oxide, such that, within the first portion, the agent is present within the layer at a concentration of less than or equal to 3 percent by volume of the layer exclusive of the voids, and wherein, within the second portion, the agent is present within the layer at a concentration up to the carrying capacity of the layer.

DRAWINGS

Figure 2:
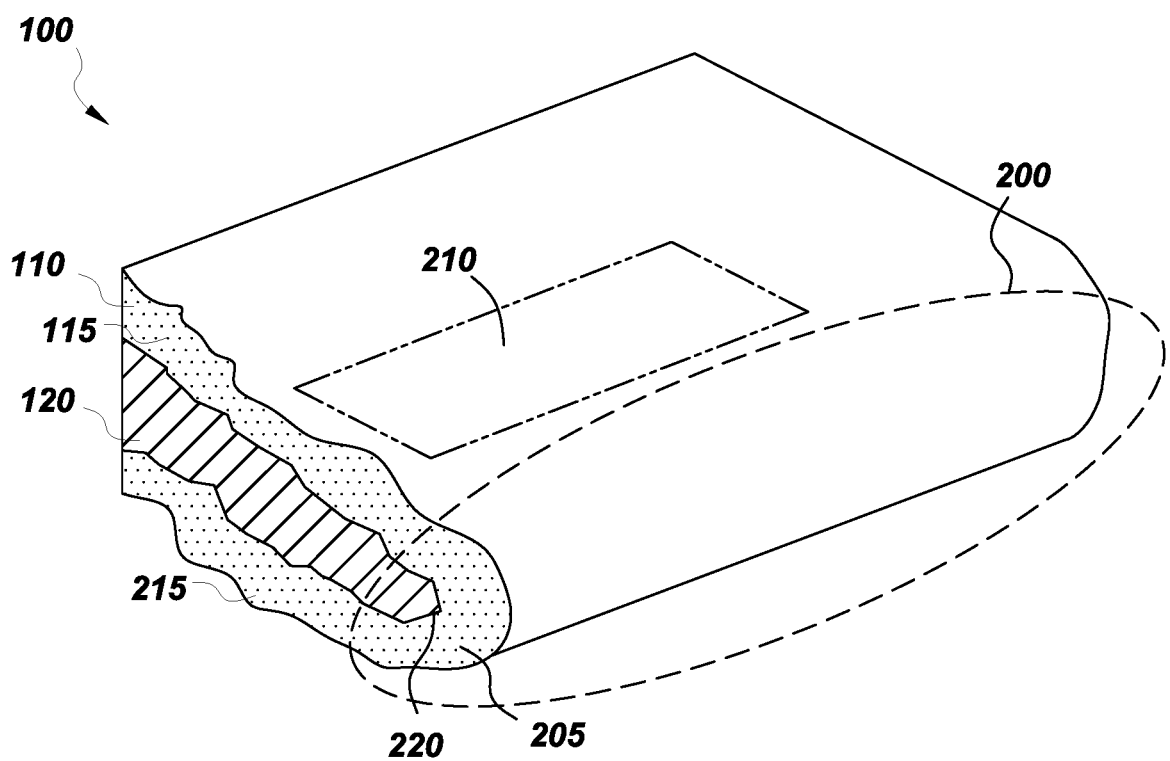
Figure 3:
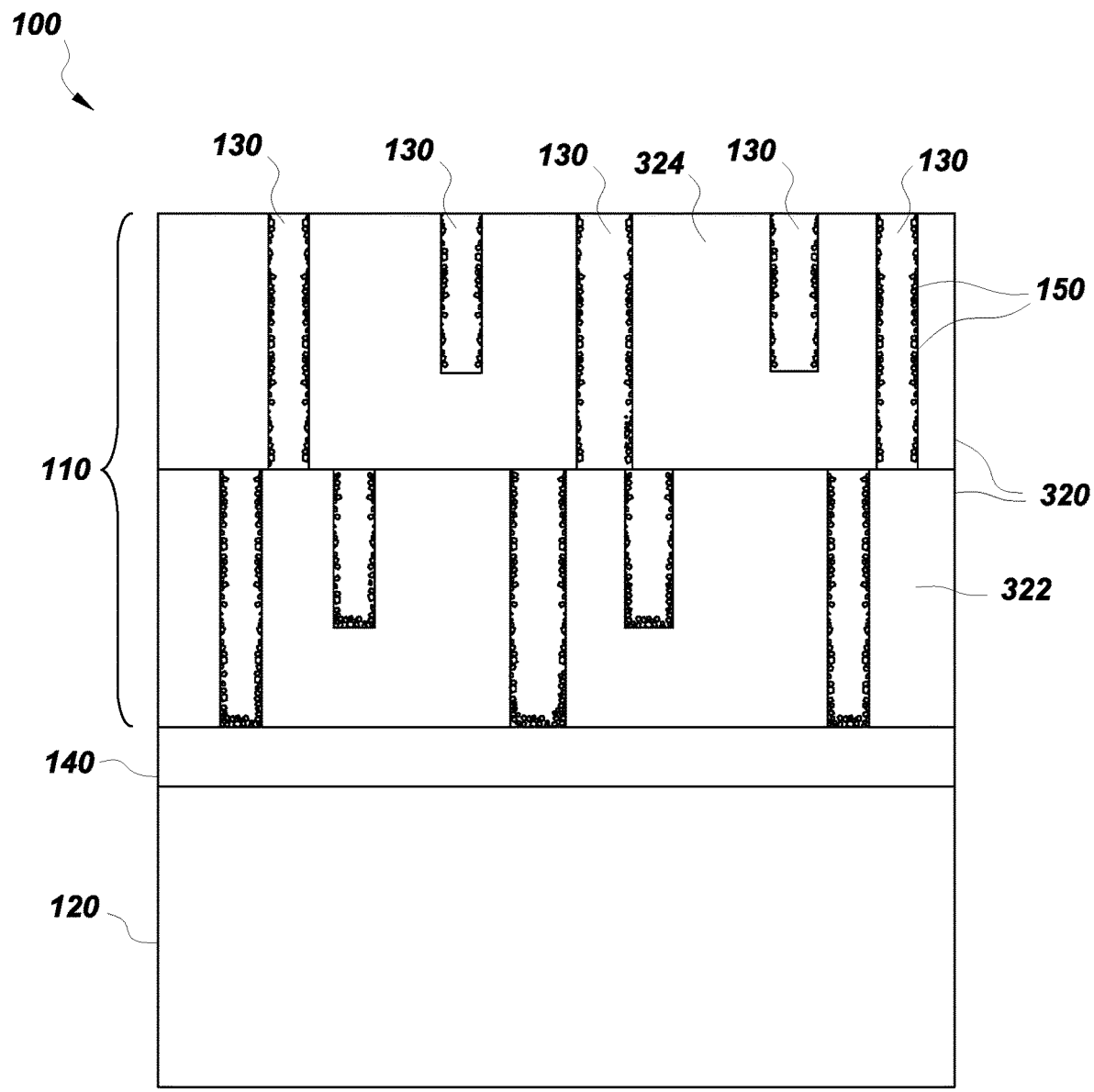

These and other features, aspects, and advantages of the present invention will become better understood when the following detailed description is read with reference to the accompanying drawing in which like characters represent like parts, wherein:

FIG. 1 is an illustrative schematic cross-sectional view of an embodiment of the present invention; and FIG. 2 is an illustrative schematic three-dimensional view, including a cross-sectional aspect, of an embodiment of the present invention; and FIG. 3 is an illustrative schematic cross-sectional view of another embodiment of the present invention.

DETAILED DESCRIPTION

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

As used herein, the terms "coating" and "layer" refer to a material disposed over at least a portion of an underlying surface in a continuous or discontinuous manner. Further, the term "coating" does not necessarily mean a uniform thickness of the disposed material, and the disposed material may have a uniform or a variable thickness. The term "coating" may refer to a single layer of the coating material or may refer to a plurality of layers of the coating material. The coating material may be the same or different in the plurality of layers.

Embodiments of the present invention incorporate a coating that includes one or more substances, referred to herein collectively as "protective agents," disposed within spaces in the coating, that is, surface-connected voids such as cracks, pores, and the like, through which molten CMAS may infiltrate the coating and ultimately may degrade it as described previously. A protective agent (also interchangeably referred to herein as simply "agent") inhibits the degradation of the coating via this CMAS infiltration mechanism. The agent is selected to operate through one or more of various inhibition mechanisms. For instance, the agent may be highly reactive to CMAS-type material, such that, at typical temperatures where CMAS is encountered in liquid form, the protective agent rapidly reacts with the CMAS to form a solid reaction product that itself is thermally and chemically stable in the presence of liquid CMAS, forming a solid-phase barrier against further CMAS ingress. As another example, the agent may interact with molten CMAS to raise the viscosity of the molten material, thereby reducing its propensity to flow into the voids of the coating. In another example, the agent provides a mechanical barrier to flow by obstructing the access of the molten material to voids.

Referring to FIG. 1, an article 100 in accordance with one embodiment of the present invention includes a coating 110 disposed over a substrate 120. The coating 110 includes a layer 115 that comprises a quantity of surface-connected voids 130 such as cracks and porosity that allow access for environmental contaminants to the interior of layer 115. Typically, though not exclusively, the voids 130 of highest interest are elongated, that is, they have an aspect ratio higher than 1, and are often oriented such that contaminants entering the void 130 can be conducted into the cross-sectional thickness of the coating 130. In some embodiments, voids 130 include substantially vertically oriented (from the perspective of a cross-sectional view as in FIG. 1) cracks and/or boundaries of grains or other microstructural features. These voids 130 may be present due to inherent characteristics of deposition processes used to deposit the layer 115; some voids 130 may also form after deposition due to normal wear and tear during operation.

Layer 115, such as a thermal barrier coating (also referred to herein, and in the art, as "TBC"), may be applied by any technique suitable for a given application. Coatings that are deposited by air plasma spray techniques, for instance, may result in a sponge-like porous structure of open pores in at least the surface of the coating. Under certain deposition conditions, well developed, vertically oriented (relative to the plane of the substrate/coating interface) cracks are also formed by plasma spraying thermal barrier coating materials. Similarly, thermal barrier coatings that are deposited by physical- or chemical-vapor deposition techniques may result in a structure including a series of columnar grooves, crevices or channels in at least the surface of the coating. A porous structure, especially (though not exclusively) a structure incorporating vertically oriented and/or columnar features as noted above, may be one of the factors that provides for strain tolerance by the thermal barrier coatings during thermal cycling. Further, the porous structure may provide for stress reduction due to the differences between the coefficient of thermal expansion (CTE) of the coating and the CTE of the underlying bond coat layer/substrate. In some embodiments, the quantity of surface-connected voids is less than or equal to 20 volume percent of layer 115, and in particular embodiments this quantity is less than or equal to 15 volume percent of layer 115.

An optional bondcoat 140 is disposed between layer 115 and substrate 120 in some embodiments. Bondcoat 140 provides functionality—adhesion promotion and oxidation resistance, for example—similar to what such coatings generally provide in conventional applications. In some embodiments, bondcoat 140 comprises an aluminide, such as nickel aluminide or platinum aluminide, or a MCrAlY-type coating well known in the art. These bondcoats may be especially useful when applied to a metallic substrate 120, such as a superalloy. In other embodiments, bondcoat 140 comprises a silicide compound or elemental silicon, which are often associated with ceramic-based substrates, such as silicon carbide-reinforced silicon carbide ceramic matrix composites (CMC's). These coatings 140 may be applied using any of various coating techniques known in the art, such as plasma spray, thermal spray, chemical vapor deposition, or physical vapor deposition.

Article 100 may be any component that is subject to service in a high-temperature environment, such as a component of a gas turbine assembly—particularly the so-called "hot-gas-path components" as those parts are known in the art. Examples of such components include, but are not limited to, components that include turbine airfoils such as blades and vanes, combustion components such as liners and transition pieces, and other components found in the hot gas path, such as heat shields and deflectors. Substrate 120, then, may be any material suitable for use in such applications; examples include nickel-base superalloys, cobalt-base superalloys, iron-based superalloys, and ceramic matrix composites, to name a few.

Layer 115 generally includes a ceramic material, such as a thermal barrier coating material. Suitable ceramic coating materials often used as thermal barriers or for other functions include various types of oxides, such as hafnium oxide ("hafnia") or zirconium oxide ("zirconia"), in particular stabilized hafnia or stabilized zirconia, and blends including one or both of these. As used herein, the term "stabilized" in the context of ceramic coatings includes fully stabilized materials and partially stabilized materials, as these terms are commonly used in the art. Examples of stabilized zirconia include, without limitation, yttria-stabilized zirconia, ceria-stabilized zirconia, calcia-stabilized zirconia, scandia-stabilized zirconia, magnesia-stabilized zirconia, india-stabilized zirconia, ytterbia-stabilized zirconia, lanthana-stabilized zirconia, gadolinia-stabilized zirconia, as well as mixtures of such stabilized zirconia. Similar stabilized hafnia compositions are known in the art and are suitable for use in embodiments described herein.

In certain embodiments, layer 115 includes yttria-stabilized zirconia. Suitable yttria-stabilized zirconia may include from about 1 weight percent to about 20 weight percent yttria (based on the combined weight of yttria and zirconia), and more typically from about 3 weight percent to about 10 weight percent yttria. An example yttria-stabilized zirconia thermal barrier coating includes about 8% yttria and about 92% zirconia. These types of zirconia may further include one or more of a second metal (e.g., a lanthanide or actinide) oxide, such as dysprosia, erbia, europia, gadolinia, neodymia, praseodymia, urania, and hafnia, for example to further reduce thermal conductivity of the thermal barrier coating material, to enhance phase stability, and/or to enhance CMAS resistance. In some embodiments, the thermal barrier coating material may further include an additional metal oxide, such as, titania.

Suitable ceramic materials may also include pyrochlores of general formula $A_2B_2O_7$ where A is a metal having a valence of 3+ or 2+ (e.g., gadolinium, aluminum, cerium, lanthanum or yttrium) and B is a metal having a valence of 4+ or 5+ (e.g., hafnium, titanium, cerium or zirconium) where the sum of the A and B valences is 7. Representative materials of this type include gadolinium zirconate, lanthanum titanate, lanthanum zirconate, yttrium zirconate, lanthanum hafnate, cerium hafnate, and lanthanum cerate.

Layer 115 may include the ceramic material in an amount of up to 100 weight percent of the layer. In some embodiments, the layer 115 includes the ceramic thermal barrier coating material in a range from about 95 weight percent to about 100 weight percent and more particularly from about 98 weight percent to about 100 weight percent. The selected composition of layer 115 may depend upon one or more factors, including the composition of the optional, adjacent bondcoat layer 140 (if present), the coefficient of thermal expansion (CTE) characteristics desired for layer 115, and the thermal barrier properties desired for layer 115.

The thickness of layer 115 may depend upon the substrate or the component it is deposited on. In some embodiments, layer 115 has a thickness in a range of from about 25 microns to about 2000 microns. In some embodiments, layer 115 has a thickness in a range of from about 25 microns to about 1500 microns. In some embodiments, the thickness is in a range of from about 25 microns to about 1000 microns.

Referring again to FIG. 1, a protective agent 150 is disposed within at least some of the voids 130 of layer 115. Protective agent 150 has the characteristics described above with respect to the ability of its component substance(s) to inhibit CMAS infiltration through one or more mechanisms, such as by chemical reaction, occlusion, or melt viscosity increase. In some embodiments, such as the illustrative embodiment shown in FIG. 1, agent 150 decorates the surface of voids 130 in a discrete arrangement, while in other embodiments agent forms a continuous or substantially continuous structure within voids 130.

While other techniques have been described in which material is disposed on internal surfaces of ceramic coatings, for instance to prevent sintering of columnar microstructural features, the present technique involves the disposition of an effective concentration of agent 150 to substantially prevent incursion of CMAS into voids in which agent 150 is disposed. Moreover, the present inventors have discovered that the presence of agent 150 at too high a concentration unexpectedly degraded the mechanical properties of the coating, resulting—under certain circumstances—in coatings with substantially reduced lifetimes in standard tests involving cycling exposure to high temperatures. After significant investigation, the present inventors discovered a correlation between the concentration of agent present in the coating and the ability of the coating to accommodate strain, such as strain induced during thermal cycling. Without being bound by theory, the agent particulates may serve as bridging points at which columnar structures may become pinned together, reducing coating compliance. Thus, rather than simply loading the coating with as much agent as the coatings' voids can hold, as might be inferred from the prior art, the articles and techniques disclosed herein base the amount of agent disposed in layer 115 on a balance between the desired level of protection against CMAS infiltration and the need to preserve acceptable levels of durability.

In particular, the present inventors discovered that the reduced coating compliance attributable to the presence of the agent was an underlying cause of the problem of premature coating failures, especially where service conditions such as strain levels were comparatively aggressive. For example, agent-loaded coatings on substrates with convex curvature tended to fail substantially earlier than those on flat substrates. Given that many useful machinery components, such as gas turbine components, include regions expected to produce respectively varying local levels of strain during service, due to curvature, degree of exposure to hot gas during service, and/or other localized conditions, the advantages of tailoring the agent loading to the localized service conditions expected for a given substrate became clear.

Accordingly, referring to FIG. 2, the substrate 120 from the above description comprises a first region 200 and a second region 210. Coating 110 includes a first portion 205 disposed over first region 200 of substrate 120, and a second portion 215 disposed over second region 210 of substrate 120. First region 200 may correspond to a region that is expected to require higher coating compliance during service than second region 210. For example, in some embodiments, first region 200 includes a feature 220 having a higher convex curvature than second region 210. Examples of such a feature 220 include without limitation an airfoil leading edge, an airfoil tip, a cooling hole edge, and an airfoil suction side, all of which are well known in the art to have convex curvature.

To address the source of the problem of layer compliance degradation by high agent loading, in embodiments of the present invention the agent 150 is present within first portion 205 at a concentration level that is less than or equal to 4 percent by volume of the layer, exclusive of the voids. This means that the ratio of agent volume to the volume of all solid matter present in the layer 115 is less than or equal to 4 percent. Volume percentages discussed herein may be derived, for example, by performing electron microprobe analysis over a representative area of a given region of interest, obtaining a weight percentage of elements present using wavelength dispersive spectroscopy, and then converting the weight percent to volume percent. Another method for deriving the volume percentages includes calculating an equivalent volume fraction of agent based on the net weight increase of the article 100 after disposing the agent 150 within the layer 115. Values obtained using both methods have been shown to have reasonable correlation.

Testing on both flat and curved specimens suggested that maintaining agent concentration within this range preserved a degree of layer compliance suitable for use in some aggressive applications, such as where layer 150 is disposed over a substrate region having moderate convex curvature. However, even lower agent loading was found to be desirable in particularly challenging situations, such as where layer 150 is disposed over a substrate region of high convex curvature, or where the compliance of layer 150 may be compromised by its microstructure, such as where layer 150 has low levels of porosity. Therefore, in particular embodiments, agent 150 is present within first portion 205 a concentration level that is less than or equal to 3 percent by volume of the layer, exclusive of the voids, and in certain embodiments this concentration level may be further controlled to be less than 2 percent, such as, for instance, less than 1 percent, where, as above, the percentages are by volume, exclusive of the voids. In some embodiments, the concentration is zero, such that no agent is disposed within first portion 205.

In other regions of article 100, such as in second region 210, the need to maintain layer compliance is not as critical, for example because localized operating stress is not as high as in first region 200. In such regions as second region 210, a broader range of agent 150 concentration may be considered. Generally, within second portion 215 of coating 110—that is, the portion of coating 110 disposed over second region 210 of substrate 120—agent 150 is present within layer 115 at a concentration ranging from zero volume percent up to the point where all available surface connected voids 130 are full of agent (the "carrying capacity" of layer 115). In some embodiments, the concentration of agent 150 in first portion 205 is lower than the concentration of agent in second portion 215, which reflects a strategy of maintaining lower amounts of agent 150 in critical regions to mitigate the deleterious effects of agent loading on coating mechanical properties, while retaining higher amounts of agent 150 where coating compliance is less critical to local coating performance. Where a particular application requires maintaining a desired level of compliance for layer 150 in second portion 215, concentration of agent 150 may be controlled to be some fraction of the carrying capacity of layer 115, such as a concentration up to 75% of carrying capacity or, in certain embodiments, up to 50% of carrying capacity.

It will be appreciated that the composition of agent 150 disposed in first portion 205 need not be identical to that disposed in second portion 215. Also, while a zero concentration of agent 150 is possible in layer 115 at either first portion 205 or second portion 215, layer 115 overall has a non-zero concentration of agent 150. The minimum value for concentration is typically set based in part on a desired level of protection from CMAS infiltration. In some embodiments, the concentration of agent 150 is at least 0.5 volume percent (exclusive of porosity) in layer 115 within first portion 205, within second portion 215, or within both portions. Concentrations at or above this value have been shown to have a measurable protective effect against CMAS infiltration.

In some embodiments, the concentration of agent 150 is a function of the cross-sectional depth, with comparatively higher concentrations of agent at or near the layer outer surface (i.e., the surface closer to the ambient environment) trending to comparatively low concentrations as distance from the layer outer surface increases (that is, as distance away from substrate 120 decreases). This gradient in concentration may occur in layer 115 in any portion of coating 110, such as first portion 205, second portion 215, or both portions. As an illustrative, non-limiting example, the concentration of agent 150 is at least about 0.5 percent by volume of layer 115 (exclusive of voids) in a region above, that is, on the side distal to the substrate 120 of, the half-thickness point 111 of the layer 115, with concentration lower than this level in a region below (that is, on the side proximal to the substrate 120 of) the half-thickness point 111.

As noted previously, protective agent 150 includes one or more substance that inhibits incursion of liquid CMAS into voids 130, thereby helping to maintain strain tolerance of layer 115. Typically, though not necessarily exclusively, protective agent 150 comprises a ceramic material such as an oxide or a nitride. Various types of suitable oxides are described in more detail, below. Examples of suitable nitrides include, but are not limited to, nitrides of tantalum or titanium.

One example of a suitable oxide is an oxide comprising aluminum, such as alumina or any of various aluminates such as rare-earth aluminates. The use of alumina, for example, has been described in U.S. Patent Application Publication No. US20040115470, and the use of rare earth aluminates as a CMAS protective material has been described in U.S. Pat. No. 8,062,759. Aluminum-bearing compounds may react with CMAS to form phases with higher melting points than the original CMAS material, which may increase the viscosity of the melt or solidify it, depending on the temperature and particular composition. Such materials may also react slowly with CMAS, serving in part as a mechanical barrier to further infiltration.

In some embodiments, the protective agent includes a rare-earth oxide, that is, an oxide compound that includes a rare-earth element as one of its constituent elements. As used herein, the terms "rare-earth" and "rare-earth element" are used interchangeably, and encompass elements of the lanthanide series, yttrium, and scandium. For example, in some embodiments, the oxide includes lanthanum, neodymium, erbium, cerium, gadolinium, or combinations including any one or more of these. Certain complex oxides, that is, oxide compounds that include more than one metal element constituent, have been shown in some circumstances to provide comparatively high reactivity with liquid CMAS. In particular embodiments, the oxide is a complex oxide that includes a rare-earth element and a transition metal element, such as zirconium, hafnium, titanium, or niobium, along with combinations of these. Zirconates, hafnates, titanates, and niobates that include lanthanum, neodymium, cerium, and/or gadolinium are examples of such complex oxide. A particular example is gadolinium zirconate, which has been shown, for example, by Kramer, Yang, and Levi at University of California, Santa Barbara, to react with liquid CMAS to form a stable crystalline apatite phase that may serve as a barrier to liquid CMAS incursion, prompting the authors to suggest this material may be useful as a bulk coating material.

Other complex rare-earth compound structures may be useful as a CMAS-reactive substance in the protective agent 150 as described herein. In one embodiment, the substance has a weberite crystal structure. Use of such materials as CMAS-resistant coatings is described in commonly-owned U.S. patent application Ser. No. 14/525,586, filed on 28 Oct. 2014. The weberite structure is an anion-deficient fluorite-related superstructure. Compared with fluorites, the reduction in the number of anions leads to a decrease in the coordination number of the so-called "B cations" (those of VI coordination) with respect to the "A cations" (VIII coordination), thus allowing the accommodation of diverse cations. The term "weberite crystal structure" as used herein refers to crystal structure of a family of materials with the general formulation $A_2B_2X_7$ or $A_3BX_7$, wherein A includes a rare earth metal ion, B includes tantalum (Ta) and/or niobium (Nb), and X comprises oxygen or fluorine. Further details of the structure have been described in "Complex Ceramic Structures I Weberites", Cai et al., *Acta Crystallographica*. Part B, Vol. 63, Part 3, 2009. While several other compounds possess the same stoichiometry (pyrochlores, layered perovskites etc.), the weberite compounds are isomorphous to the fluoride mineral $Na_2MgAlF_7$.

In some embodiments, the substance having a weberite structure comprises a rare-earth element, oxygen, and one or more element selected from the group consisting of tantalum and niobium. In particular embodiments, the substance has a nominal formula $A_3BX_7$, wherein A comprises a rare earth metal element, B comprises tantalum, niobium, or combinations thereof, and X comprises oxygen, fluorine, or combinations thereof. In one example, the substance having a weberite crystal structure includes gadolinium, oxygen, and at least one element selected from the group consisting of tantalum and niobium. As described in the aforementioned patent application, two different weberite oxide ($Gd_3NbO_7$ and $Gd_3TaO_7$) powder compositions were observed to react quickly and completely with liquid CMAS to form a reaction product having a desirably stable apatite-type structure with a nominal composition $Ca_2Gd_8(SiO_4)_6O_2$.

In other embodiments, the protective agent comprises an NZP type material, as described in commonly owned U.S. patent application Ser. No. 14/524,072, filed on 27 Oct. 2014. The term "NZP-type material" as used herein refers to a family of materials having a crystal structure similar to $NaZr_2P_3O_{12}$ (the parent compound from which the name is derived). The NZP materials typically have a three-dimensional "open" framework structure, with $ZrO_6$ octahedra linked to $PO_4$ tetrahedra. In some embodiments, the NZP-type material has a hexagonal structure. As for the other materials described above, NZP-type materials have been described previously as candidates for bulk coatings. In the present description, however, these materials are disposed in the voids 130 of a bulk layer 115.

In one embodiment employing NZP-type material as a substance of the protective agent 150, the substance is a material having formula (I):

$$A_{1-x}B_xZr_{4-y}D_y(PO_4)_z$$

wherein A and B are selected from the group consisting of alkaline earth metals and rare earth metals, D is hafnium or titanium; x is a number from 0 to 1; y is a number from 0 to 4; and z is 3 or 6. Non-limiting examples of suitable alkaline earth metals include beryllium, magnesium, calcium, strontium, barium, or combinations thereof. Non-limiting examples of suitable rare earth metals include scandium, yttrium, lanthanum, cerium, gadolinium, praseodymium, neodymium, promethium, samarium, europium, terbium, dysprosium, holmium, erbium, thulium, ytterbium, lutetium, or combinations thereof.

In some embodiments, the protective agent includes $MZr_4(PO_4)_6$, wherein M includes at least one alkaline earth metal. As noted earlier, M may include beryllium, magnesium, calcium, strontium, barium, or combinations thereof. In certain embodiments, the CMAS-reactive material includes $Ca_xSr_{1-x}Zr_4(PO_4)_6$, wherein x is a number from 0 to 1. In certain embodiments, the CMAS-reactive material includes $CaZr_4(PO_4)_6$, $SrZr_4(PO_4)_6$, $Ca_{0.5}Sr_{0.5}Zr_4(PO_4)_6$, or combinations thereof. As noted in the aforementioned Ser. No. 14/524,072 application, each of these three compositions was observed to react quickly and completely with liquid CMAS, forming stable solid reaction products such as silicates and phosphates that may provide desirable barrier behavior when formed within voids 130 of layer 115.

In other embodiments, the protective agent has a perovskite crystal structure and comprises (a) a rare earth element, (b) tantalum, niobium, or a combination of tantalum and niobium, and (c) oxygen. In one embodiment, the perovskite-structured substance is an oxide having a nominal composition of $AB_3O_9$, where A comprises the rare earth element, and B comprises the niobium, tantalum, or combination of tantalum and niobium. A perovskite-structured oxide of nominal composition $GdTa_3O_9$ is a particular example of such a substance; this composition was observed in a laboratory test to rapidly and completely react with a liquid CMAS composition, forming a desirably solid, dense, blocky crystalline phase that may provide a suitable barrier to liquid CMAS penetration into layer 115.

In other embodiments, the protective agent includes a compound having a scheelite, fergusonite, or wolframite crystal structure, and having a nominal formula $ABX_4$, wherein A comprises a rare-earth element (and, optionally, an alkaline earth element), B comprises tantalum, niobium, or a combination of tantalum and niobium, and X comprises oxygen, nitrogen, or a combination of nitrogen and oxygen. In certain embodiments, A in this formula comprises yttrium, gadolinium, lanthanum, neodymium, ytterbium, or combinations of any of the foregoing. A particular example of such material is $YTaO_4$, which in laboratory tests was observed to react quickly with liquid CMAS to form a stable crystalline solid reaction product.

Coating 110 is shown in FIG. 1 as a single layer 115, but in some embodiments, such as that illustrated in FIG. 3, coating 110 comprises a plurality of layers 320. In the embodiment illustrated in FIG. 3, coating 110 includes a first layer 322, comprising a first material, and a second layer 324 comprising a second material. First layer 322 is disposed between second layer 324 and substrate 120. The second material is resistant to CMAS infiltration. A material is considered "resistant to CMAS infiltration" in this context if it is more resistant, relative to 8 weight percent yttria stabilized zirconia ("8YSZ"), to infiltration by liquid CMAS.

Many different materials have been described in the art as providing enhanced CMAS protection relative to yttria-stabilized zirconia and other standard TBC materials, and any of these materials may be considered for use in second layer 322 described above. In one embodiment, the second material includes an oxide. Oxides that include one or more transition metal elements, rare-earth elements, silicon, and/or indium have been described in the art as being resistant to CMAS. In one embodiment, the oxide includes zirconium, hafnium, titanium, or combinations thereof. Zirconia, hafnia, and/or titania materials stabilized with one or more rare-earth elements have been described in the art of CMAS-resistant coatings. Examples of such materials include coatings comprising zirconia with one or more rare earth oxides such as gadolinia and/or ytterbia, with or without yttria present; and coatings containing mixtures of gadolinia and hafnia. Examples of other potentially suitable oxide materials include pyrochlores, such as lanthanum zirconate; garnets, such as those described in U.S. Pat. No. 7,722,959; and oxyapatites, such as those described in U.S. Pat. No. 7,722,959. Sodium-containing oxides, such as sodium oxide, sodium silicate, and sodium titanate, are other examples of CMAS resistant oxide materials.

In one particular example, the second material includes yttria-stabilized zirconia (YSZ) having higher yttria content (relative to the overall YSZ content) than typical 8YSZ. Generally, the yttria content in this example is greater than 38 weight percent, and in specific embodiments the yttria content is at least about 55 weight percent. Coatings as described herein using YSZ with yttria content greater than 38 weight percent were superior in CMAS resistance to coatings made with lower-yttria YSZ materials.

Other materials besides oxides have been described for use in resisting CMAS, and are also considered as potentially useful as second materials in second layer 322. Examples of such alternative materials include carbides (such as silicon carbide, tantalum carbide, titanium carbide, and others), nitrides (such as silicon nitride, zirconium nitride, tantalum nitride, boron nitride, and others), and silicides (such as chromium silicide, molybdenum silicide, tantalum silicide, titanium silicide, and others).

Protective agent 150 is distributed within surface-connected coating voids 130 as described previously, and in the context of embodiments involving multiple layers 320 (FIG. 3), the protective agent 150 is, in some embodiments, disposed in just a portion of the layers 320, such as in second layer 324 only, or first layer 322 only; while in certain embodiments, such as the example illustrated in FIG. 3, protective agent 150 is disposed in all layers 320.

One potential advantage of the technique described herein is that it allows the use of an outermost layer, such as layer 322, that has desirable wear, erosion, thermal, or other properties, while disposing CMAS resistant material (i.e., protective agent 150) in the places where it is most needed. Many of the materials that are highly reactive with CMAS lack suitable levels of mechanical properties or other properties to be desirable choices for a bulk coating that is exposed to the ambient service environment of, for instance, a gas turbine. On the other hand, zirconia stabilized with 7%-9% yttria by weight is a very attractive material for use in thermal barrier coatings because of its advantageous thermal and mechanical properties, but its resistance to CMAS is not particularly high. The life of such a coating material may be enhanced by applying protective agent 150 to vulnerable areas (such as the surface-connected voids 130 as noted herein) without resorting to the use of a bulk topcoat made of a CMAS-resistant material, which may itself be more vulnerable than YSZ to erosion or other degradation mechanism.

To further illustrate the above description, one embodiment of the present invention is an article 100. Article 100 includes a substrate 120 comprising a first region 200 and a second region 210, wherein the first region 200 includes a feature 220 having a higher convex curvature than the second region 210. Substrate 120 further comprises a nickel-based superalloy, a cobalt-based superalloy, an iron-based superalloy, or a combination including one or more of the foregoing. A coating 110 is disposed over the substrate 120, and the coating 110 comprises a first portion 205 disposed over first region 200 of substrate 120 and a second portion 215 disposed over second region 210 of substrate 120. Coating 110 comprises a layer 115 comprising yttria-stabilized zirconia and further including a quantity of surface-connected voids 130 (FIG. 1) of up to 15 volume percent of the layer 115. A protective agent 150 comprising aluminum oxide is disposed within at least some of the surface-connected voids 130 of the layer 115. Within first portion 205, the agent 150 is present within layer 115 at a concentration of less than or equal to 3 percent by volume of the layer 115 exclusive of the voids 130, and within second portion 215, agent 150 is present within layer 115 at a concentration up to the carrying capacity of layer 115.

A method for making articles such as article 100 includes disposing protective agent 150 within surface connected voids 130 of layer 115. Within first portion 205 of coating 110, agent 150 is disposed within layer 115 at a concentration of less than or equal to 4 percent by volume of the layer exclusive of the voids, and wherein, within the second portion 215, the agent 150 is disposed within the layer 115 at a concentration up to the carrying capacity of the layer 115.

As noted previously, layer 115 may be disposed on substrate 120 by any of several different coating techniques, such as plasma spray techniques (for example, air plasma spray using dry or liquid feedstock materials), chemical vapor deposition, physical vapor deposition (for example, electron-beam physical vapor deposition or evaporation), slurry deposition, sol-gel techniques, and other coating methods.

Disposing protective agent 150 typically involves infiltrating an existing layer 115 with a vapor or liquid into the surface-connected voids 130 of the layer 115. In the case of a vapor infiltrant, protective agent 150 may be formed by chemical interaction with the environment within voids 130 such as by reaction with material of layer 115. Liquid infiltrants, on the other hand, include one or more liquids such as water, or a carbon-bearing liquid such as an alcohol or acetone. In one embodiment involving a liquid infiltrant, the liquid includes a carrier fluid and a plurality of particles suspended within the carrier fluid. The particles may comprise the protective agent 150 composition, or may be a chemical precursor to this composition, designed to further react during processing or during service to produce protective agent 150. In an alternative embodiment, the liquid includes a solvent, with a solute dissolved in the solvent. The solute may be a precursor of protective agent 150, such as a nitrate, sulfate, other salt, or other compound type, and the solvent is selected to appropriately accommodate the desired solute. More than one solute may be dissolved in the solvent. The solute may be reacted to form agent 150, such as by heating to decompose the solute, or by reacting multiple solutes together, or by reacting one or more solute with the material of layer 115, or some combination of these.

The liquid infiltrant is infiltrated into the surface-connected voids 130 using any appropriate technique. In some embodiments, the liquid is simply placed in contact with layer 115, such as by dipping or brushing, allowing capillary action to draw the liquid and agent 150 (or precursor thereof) into the voids 130. Vacuum infiltration techniques are applied in some embodiments to further assist in driving liquid into layer 115. Other techniques such as electrophoretic deposition may be used in conjunction with a suspension to deposit particles of agent or a precursor of agent 150 into voids 130. Use of electrophoretic deposition to deposit material within the voids of a ceramic coating is described by Hasz in U.S. Pat. No. 7,780,832.

Where a liquid infiltrant is applied, whether the liquid is carrying a suspension of particles or has a solute dissolved in it, in some embodiments the method further includes volatilizing the liquid to form a residue that is disposed in voids 130. The residue may be a precursor to agent 150, or it may be the agent composition itself. Volatilizing is typically done by heating the infiltrated layer to a temperature where the liquid is driven off at an acceptable rate. Often the heating rate ("ramp-rate") to attain the desired temperature for volatilization is controlled to avoid building up undue pressure within the layer, which could damage the coating and/or could result in incomplete deposition of protective agent due to liquid being forced out by rapid bubble formation and escape.

To further illustrate the above description, one embodiment of the present invention is a method for fabricating an article such as article 100. The method includes the following steps: 1) infiltrating a liquid solution comprising an agent precursor comprising an aluminum compound into surface-connected void space of a layer of a coating disposed on a substrate, the layer comprising yttria-stabilized zirconia, the coating comprising a first portion disposed over a first region of the substrate and a second portion disposed over a second region of the substrate, and the first region comprising a feature having a higher convex curvature than the second region; 2) volatilizing the liquid; and 3) converting the agent precursor into a protective agent comprising aluminum oxide, such that, within the first portion, the agent is present within the layer at a concentration of less than or equal to 3 percent by volume of the layer exclusive of the voids, and wherein, within the second portion, the agent is present within the layer at a concentration up to the carrying capacity of the layer.

EXAMPLES

The following examples are presented to further illustrate non-limiting embodiments of the present invention.

Coupons for testing and analysis were prepared by disposing a solution containing dissolved aluminum, gadolinium or both aluminum and gadolinium onto the surface of a layer of yttria-stabilized zirconia TBC (nominally 8 weight percent yttria) disposed, with an interposed bond coat, on a convexly curved nickel superalloy substrate and allowing the solution to infiltrate the TBC before heating the infiltrated specimens to drive off the solvent and convert the dissolved species into an oxide agent. Coupons with different concentrations of agent infiltrated into the TBC were subjected to thermal cycling. The test measured the number of cycles needed to spall the TBC. Coupons with infiltrated agent were cross-sectioned and the relative amounts of agent and TBC were measured by quantitative electron microprobe analysis calibrated to external standards. The average amount of agent relative to the TBC was measured over an area 30 micrometers wide and at least 80% of the depth of the coating thickness, excluding contribution from the top 15 micrometers of the surface to minimize contribution from agent that had not actually infiltrated the layer.

The results of the testing showed a clear decrease in the number of cycles to spallation on these curved specimens, even in specimens infiltrated with the lowest tested concentration (nominally 0.5 volume percent) of agent, which showed a decrease of about a factor of 2. Moreover, the deleterious effect was shown to increase with increasing load of agent. Mean number of cycles to failure became unacceptably low in those specimens having greater than nominally 4 percent agent loading by volume.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A gas turbine assembly component comprising:
   a substrate comprising a first region and a second region; and
   a coating disposed over the substrate, the coating comprising a first portion disposed over the first region of the substrate and a second portion disposed over the second region of the substrate,
   wherein the coating comprises a layer comprising a ceramic material and further including a quantity of surface-connected voids, wherein a protective agent is disposed within at least some of the surface-connected voids of the layer,
   wherein, within the first portion, the agent is present within the layer at a first concentration of between 0.5 percent and 4 percent by volume of the layer exclusive of the voids,
   wherein, within the second portion, the agent is present within the layer at a greater, second concentration of between 50 percent of a carrying capacity of the layer up to the carrying capacity of the layer, and
   wherein the first region of the substrate includes a feature having a higher convex curvature than the second region.

2. The component of claim 1, where the first region comprises at least one feature selected from the group consisting of an airfoil leading edge, an airfoil trailing edge, a cooling hole edge, and an airfoil suction side.

3. The component of claim 1, wherein the ceramic material comprises stabilized zirconia.

4. The component of claim 1, wherein the ceramic material comprises yttria-stabilized zirconia, ceria-stabilized zirconia, calcia-stabilized zirconia, scandia-stabilized zirconia, magnesia-stabilized zirconia, india-stabilized zirconia, ytterbia-stabilized zirconia, lanthana-stabilized zirconia, gadolinia-stabilized zirconia, or a combination including one or more of the foregoing.

5. The component of claim 1, wherein the agent comprises an oxide.

6. The component of claim 5, wherein the oxide comprises aluminum.

7. The component of claim 5, wherein the oxide comprises aluminum oxide.

8. The component of claim 5, wherein the oxide comprises a rare earth oxide; a substance having a weberite crystal structure; an NZP-type material; or a perovskite comprising (a) a rare earth element, (b) tantalum, niobium, or a combination of tantalum and niobium, and (c) oxygen.

9. The component of claim 1, wherein the quantity of surface-connected voids is less than or equal to 20 volume percent of the layer.

10. The component of claim 1, wherein the quantity of surface-connected voids is less than or equal to 15 volume percent of the layer.

11. The component of claim 1, wherein, within the first portion of the layer, the agent is present within the layer at a concentration of less than or equal to 3 percent by volume of the layer exclusive of the voids.

12. The component of claim 1, wherein, within the first portion of the coating, the second portion of the coating, or both portions, the concentration of the agent is lower in a region of the layer proximate to the substrate and higher in a region distal to the substrate.

13. The component of claim 1, wherein the substrate comprises a nickel-based superalloy, a cobalt-based superalloy, an iron-based superalloy, or a combination including one or more of the foregoing.

14. The component of claim 1, wherein the component comprises a hot-gas-path component for a gas turbine assembly.

15. A gas turbine assembly component comprising:
a substrate comprising a first region and a second region, wherein the first region includes a feature having a higher convex curvature than the second region, the substrate further comprising a nickel-based superalloy, a cobalt-based superalloy, an iron-based superalloy, or a combination including one or more of the foregoing; and a coating disposed over the substrate, the coating comprising a first portion disposed over the first region of the substrate and a second portion disposed over the second region of the substrate, wherein the coating comprises a layer comprising yttria-stabilized zirconia and further including a quantity of surface-connected voids of up to 15 volume percent of the layer, wherein a protective agent comprising aluminum oxide is disposed within at least some of the surface-connected voids of the layer, wherein, within the first portion, the agent is present within the layer at a first concentration of 0.5 to 3 percent by volume of the layer exclusive of the voids, and wherein, within the second portion, the agent is present within the layer at a greater, second concentration of between 50 percent of a carrying capacity of the layer up to the carrying capacity of the layer.

\* \* \* \* \*